United States Patent [19]

Patel et al.

[11] Patent Number: 5,537,502
[45] Date of Patent: Jul. 16, 1996

[54] LASER PACKAGE WITH PERMANENTLY ALIGNED CRITICAL COMPONENTS

[75] Inventors: Rushikesh M. Patel, Pomona; Lesley Rogers, Los Angeles; Michael M. Ung, Ontario, all of Calif.

[73] Assignee: Opto Power Corporation, Tucson, Ariz.

[21] Appl. No.: 386,412

[22] Filed: Feb. 10, 1995

[51] Int. Cl.⁶ ............................................. G02B 6/36
[52] U.S. Cl. .................................... 385/92; 385/93
[58] Field of Search ............................. 385/92, 93

[56] References Cited

U.S. PATENT DOCUMENTS

| | | | |
|---|---|---|---|
| 4,615,031 | 9/1986 | Eales et al. | 385/92 |
| 4,707,067 | 11/1987 | Haberland et al. | 385/93 |
| 4,995,695 | 2/1991 | Pimpinella et al. | 385/92 |
| 5,307,434 | 4/1994 | Blonder et al. | 385/92 |
| 5,386,488 | 1/1995 | Oikawa | 385/92 |

*Primary Examiner*—Rodney B. Bovernick
*Assistant Examiner*—Robert E. Wise
*Attorney, Agent, or Firm*—Herbert M. Shapiro

[57] ABSTRACT

A laser package includes a housing and a subassembly to which the critical components of the laser package are mounted. The subassembly is structured to preserve component alignment even in the presence of thermal excursions by ensuring that any movement which might occur effects all the components in a way to preserve alignment. The subassembly is easily removable from the housing and thus permits replacement if a failure should occur. A reverse laser diode is included to provide a path for reverse currents which otherwise would be damaging to the active laser diode.

7 Claims, 3 Drawing Sheets

5,537,502

LASER PACKAGE WITH PERMANENTLY ALIGNED CRITICAL COMPONENTS

FIELD OF THE INVENTION

This invention relates to a laser package and, more particularly, to a low cost laser package which virtually eliminates relative movement of critical components.

BACKGROUND OF THE INVENTION

The movement of critical components in a laser package results in misalignment of, for example, a laser emitting surface and an optical fiber coupled to it for delivering power to the output of the device. Any misalignment of the emitting surface and the optical fiber reduces output power and could result in device failure. Consequently, a great deal of attention has been focused on laser mounting and packaging to avoid the effect of thermal excursions which causes such misalignment.

One effort has been directed at providing robust heat sinks for removing heat thus lowering the effects of thermal excursions. Another approach is directed at attaching the fiber to several anchoring points along the length of the fiber to avoid transmitting stress to the aligned end of the fiber abutting the laser emitting surface. In spite of such approaches, thermally-induced component movement and the resulting misalignment remain an ongoing problem in the industry.

BRIEF DESCRIPTION OF THE INVENTION

In accordance with the principles of this invention, a laser package includes a removable subassembly with a rigid ceramic surface layer to which the cylindrical lens and the optical fiber end are soldered in proper registration with the emitting surface of the laser. Any thermal excursions results in the movement of all components in a manner which avoids relative movement between them. Thus any misalignment is avoided.

Moreover, the package and the subassembly are relatively easy to assemble and the subassembly is easily removed. Consequently, a relatively low cost, partially-reusable package is achieved with fewer potential failure modes and thus expected longer lifetimes.

DETAILED DESCRIPTION OF AN ILLUSTRATIVE EMBODIMENT OF THIS INVENTION

Figure 1:
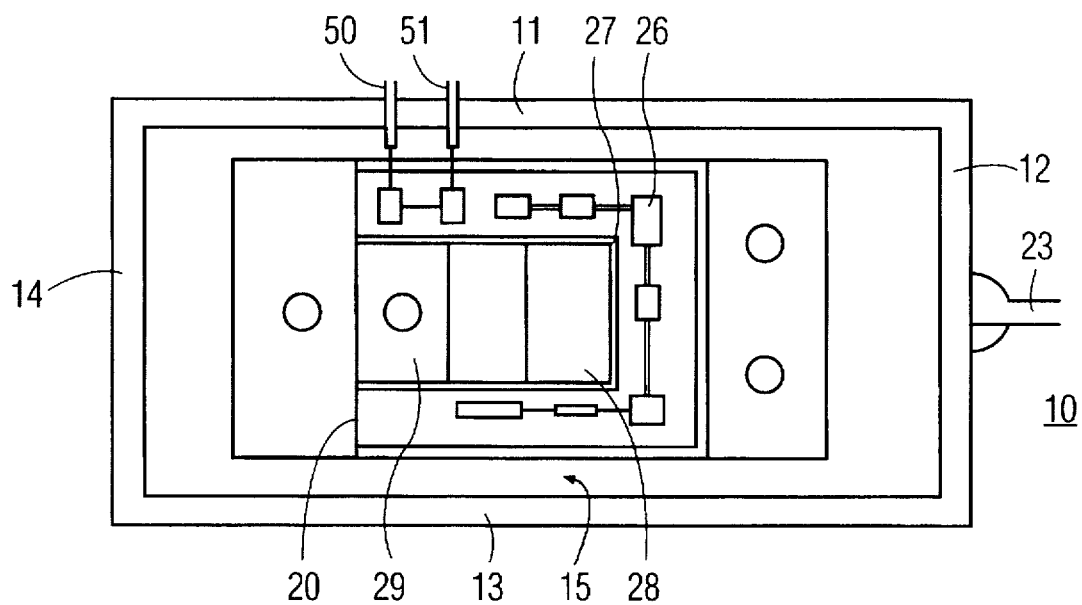
FIGS. 1 and 2 are enlarged schematic top and side views of a laser package in accordance with the principles of this invention.
Figure 2:
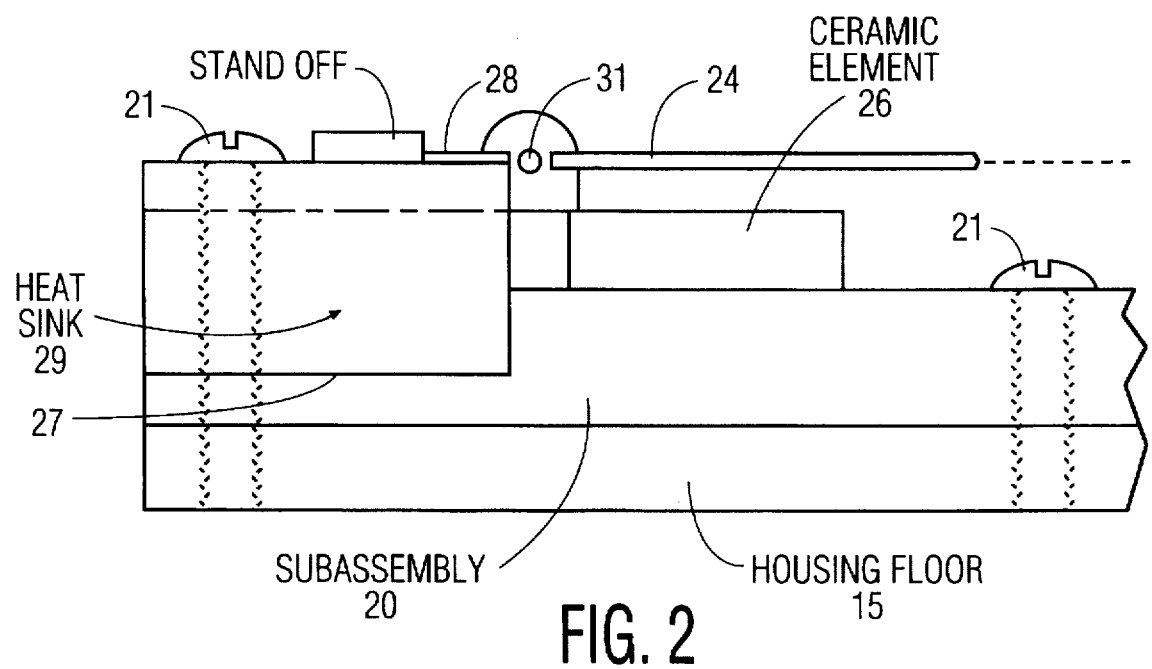

FIGS. 1 and 2 show schematic top and side views of a laser package 10 in accordance with the principles of this invention. The package comprises four walls 11, 12, 13, and 14 extending upwards from a floor 15 to define a housing into which a subassembly 20 is connected by screws 21 in FIG. 2. The package includes tubular extension ( or output port) 23 in wall 12 to receive an optical fiber 24. Support 29 also is connected to the floor of the housing by screws as shown.

The subassembly includes a recess 27 into which a laser chip 28 and support member 29 fits snugly. A rigid ceramic U-shaped layer 26 is secured about recess 27 on the top surface of the subassembly. The recess is dimensioned so that the emitting surface of the chip is positioned at the top surface of the ceramic element facing to the right, as viewed in the figures, so that the energy emitted by the emitting surface of the laser couples into the aligned optical fiber. Member 29 is soldered to subassembly 20 at recess 27 to provide stability and rigidity to the package.

Figure 3:
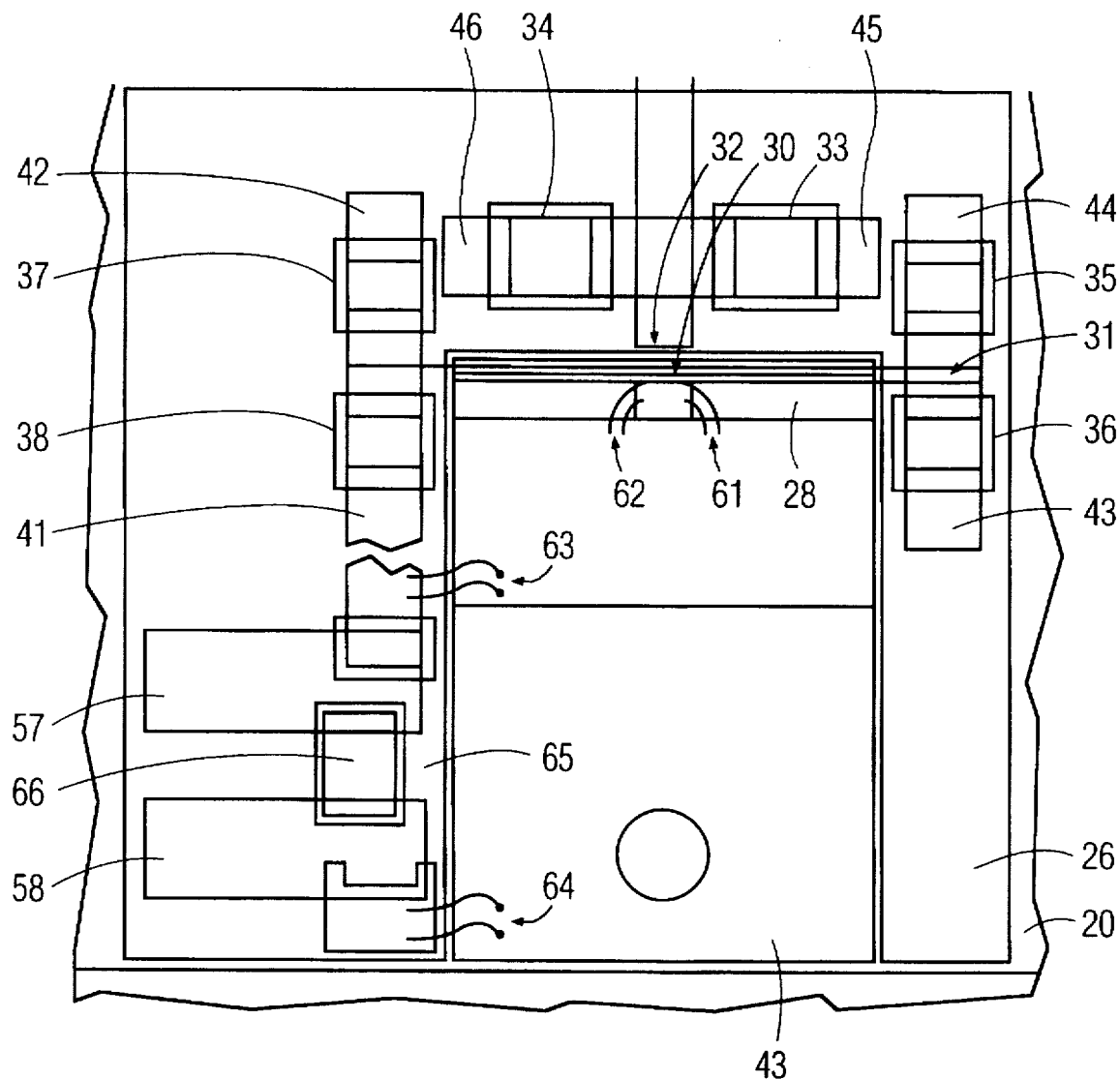
FIGS. 3 and 4 are a schematic top view of the subassembly for the package of FIGS. 1 and 2 and a pin out portion of that package respectively.

FIG. 3 shows an enlarged view of ceramic element 26 encompassing laser chip 28. The figure shows emitting surface 30 of the laser chip coupled into a cylindrical lens 31 to which end 32 of optical fiber 24 is coupled in the usual fashion. Cylindrical lens 31 is soldered into place by means of a solder hybrid comprising of resistor pad pairs 35 and 36 and 37 and 38 to which voltage is applied via metallized pads 41 and 42 and 43 and 44 correspondingly to heat solder dots positioned between the pad pairs once the cylindrical lens is properly positioned. Such a method of securing a lens is well known and disclosed, for example, in copending application Ser. No. 8/220,441 filed 3/31/94 for Leslie Rogers and Michael Ung and assigned to the assignee of the present application. The end of the optical fiber 24 is secured to ceramic element 26 in a similar manner by applying a voltage between resistor pad pair 33 and 34 via metallized pads 45 and 46. The technique employs platinum, palladium, silver contacts with a resistor formed on an aluminum oxide layer.. An impressed current generates heat, via the resistor, which melts the solder dot.

The housing dimensions, the placement of tube 23, the dimensions of the subassembly, the location of the holes for the screws to secure the subassembly to the housing, the dimensions of recess 27 and the snug fit of the chip and support in the recess are all maintained within sufficiently close tolerances so that alignment of critical elements is obtained easily during assembly so that the manufacturing method lends itself to mass production of the completed laser package. To be specific, the ceramic element has dimensions of 0.520 inch by 0.516 inch. The ceramic element encompasses an opening of 0.270 inch by 0.351 inch. FIG. 3 shows the various elements to scale. A lid (not shown) is attached to the top of walls 11, 12, 13 and 14 once the subassembly is secured in place.

Figure 4:
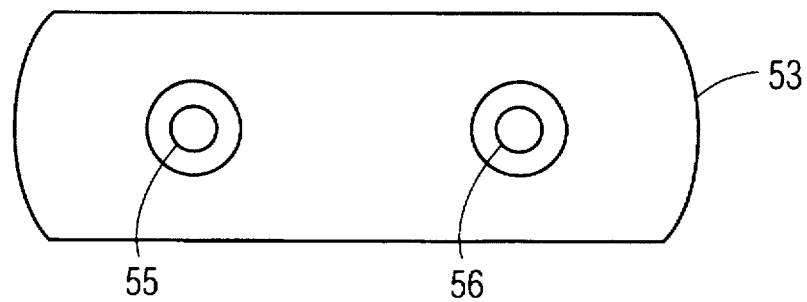

Electrical access, for power and control signals, is provided via pin outs 50 and 51 shown extending from wall 11 in FIG. 1. FIG. 4 shows an enlarged view of the pin out arrangement. The arrangement comprises a planar ceramic element 53 which mates with a recess (not shown) in wall 12. Element 53 includes spaced-apart holes 55 and 56 to which electrically-conductive pins are secured for insertion into a mating socket to which power and control signals are applied. The pins are connected electrically to lands 57 and 58 respectively (see FIG. 3). Signals and power are applied to the laser chip via wire lead pairs 61 and 62 and 63 and 64 as shown in FIG. 3. A capacitor 65 ( overlying resistor 66) also is formed on the ceramic element. The operation of the laser is analogous to that of commercially-available laser devices and, accordingly, is not discussed in detail herein. The present invention is directed at an easily manufacturable laser package which relaxes alignment constraints and avoids misalignment of critical elements during any thermal excursions which might occur during operation.

Figure 5:
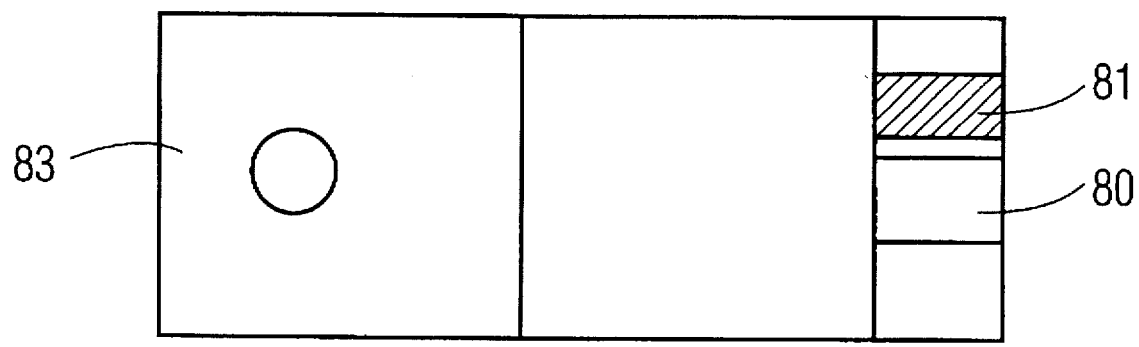
FIGS. 5 and 6 are an enlarged top view of a portion of an alternative subassembly for the package of FIGS. 1 and 2 and a circuit diagram for the laser diode arrangement in that alternative subassembly.

FIG. 5 shows an alternative arrangement for the laser support 29 and the laser device 28 of FIG. 2. Specifically, FIG. 5 shows first and second lasers 80 and 81 on a support (or heat sink) 83. Laser 80 is mounted P-side down and is a qualified, good laser diode for later operation. Diode 81 is mounted P-side up (reversed) and is a electrically good but optically inefficient diode and manufactured at the same time as the good diode in order to exhibit like characteristics. Diode 81 is used to provide a current path for any (reverse) currents generated during testing, power up, . . . etc. which otherwise might damage laser diode 80.

Figure 6:
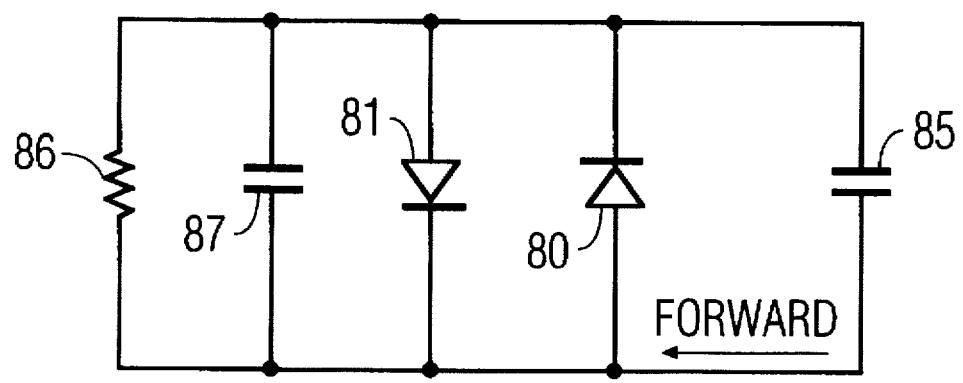

FIG. 6 shows the electrical circuit arrangement for the diodes 80 and 81. The diodes are connected electrically in parallel across a voltage source 85. The series arrangement of resistor 86 and capacitor 87 also are arranged in parallel and correspond to capacitor 65 and resistor 66 of FIG. 3..

What is claimed is:

1. A laser package including a housing having a first recess and a lid for covering said recess, said package also including a first subassembly attached to the floor of said recess, said subassembly including a ceramic member attached to the top surface of said subassembly, first, second and third solder dots formed on the top surface of said ceramic member, said subassembly having in the top surface thereof a second recess for receiving a second subassembly including a laser chip, said second recess having dimensions to secure said second subassembly in a position to align the emitting surface of said laser chip with a first of said solder hybrids.

2. A laser package as in claim 1 wherein said housing has a tube extending through a side wall thereof, said tube aligning with said emitting surface and including an optical fiber extending through said tube and communicating with said first solder hybrid for alignment with said emitting surface.

3. A laser package as in claim 2 including a cylindrical lens secured by said second and third solder hybrids, said second and third solder hybrids being positioned such that a cylindrical lens extending therebetween lies along an axis between said emitting surface and said optical fiber.

4. A laser package comprising a housing having an exit port for an optical fiber, said package including a subassembly attached to said housing, said subassembly having attached to the surface thereof a laser chip and a heat sink support therefor, a cylindrical lens and said optical fiber in positions to align the emitting surface of said laser, said lens and said optical fiber, said housing being sufficiently large to permit movement therein of said subassembly due to thermal expansion wherein said subassembly includes in a first surface thereof a recess for receiving said support and said first surface has secured thereto a ceramic solder hybrid thereon for securing said end of said fiber, said lens and said emitting surface in alignment.

5. A laser package as in claim 4 wherein said housing and said support comprise metals.

6. A laser package as in claim 5 where in said ceramic member also includes metallic pads and conductor traces extending therefrom, said housing including an aperture and a ceramic pin member for positioning conductive pins for electrical connection to said pads.

7. A laser package comprising a housing and a removable subassembly within said housing, said subassembly being detachably mounted to the floor of said housing and including in the upper surface thereof a recess for receiving a laser chip and support therefor, a ceramic member attached to said top surface and partially encompassing said recess, said ceramic member including in the top surface thereof first, second and third solder hybrids, a fiber lens attached to said ceramic member between said first and third solder hybrids, an optical fiber attached to said ceramic member at said second solder hybrid, said housing including an exit port for said optical fiber.

* * * * *